(12) United States Patent
Kato et al.

(10) Patent No.: US 8,551,854 B2
(45) Date of Patent: Oct. 8, 2013

(54) METHOD OF MANUFACTURING A SEMICONDUCTOR DEVICE

(75) Inventors: Shinjiro Kato, Chiba (JP); Hirofumi Harada, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 13/409,234

(22) Filed: Mar. 1, 2012

(65) Prior Publication Data

US 2012/0225535 A1 Sep. 6, 2012

(30) Foreign Application Priority Data

Mar. 3, 2011 (JP) .................. 2011-046807

(51) Int. Cl.
*H01L 29/8605* (2006.01)
(52) U.S. Cl.
USPC ............. 438/384; 257/359; 257/E21.004
(58) Field of Classification Search
USPC ................................... 438/382, 384
See application file for complete search history.

(56) References Cited

U.S. PATENT DOCUMENTS

| 6,211,032 B1 * | 4/2001 | Redford et al. ............... 438/384 |
| 2006/0033779 A1 * | 2/2006 | Shibata et al. ................. 347/59 |
| 2007/0056366 A1 * | 3/2007 | Sakuma et al. ............ 73/204.26 |

FOREIGN PATENT DOCUMENTS

JP        06021351        1/1994

* cited by examiner

*Primary Examiner* — Zandra Smith
*Assistant Examiner* — Pamela E Perkins
(74) *Attorney, Agent, or Firm* — Adams & Wilks

(57) ABSTRACT

In a method of manufacturing a semiconductor device, a barrier metal film and an aluminum metal film are formed on an insulating film on a semiconductor substrate. Two aluminum electrodes are formed in parallel with each other by patterning the barrier metal film and the aluminum metal film. The aluminum metal film in a region of part of each of the two aluminum electrodes are selectively removed to form two single-layer barrier metal electrodes separated from each other. A resistor is formed between the two single-layer barrier metal electrodes so as to electrically connect the two single-layer barrier metal electrodes to each other.

20 Claims, 5 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device, in particular, to a method of manufacturing a resistance element including a resistor having a thin film thickness.

2. Description of the Related Art

A manufacturing method exemplified in FIGS. 4A to 4E has conventionally been adopted for manufacturing of a resistance element used in a semiconductor integrated circuit, when a resistor has a large thickness. More specifically, first, as illustrated in FIG. 4A, a resistor 2 is processed into a desired shape on an insulating film 1. Then, as illustrated in FIG. 4B, an interlayer insulating film 3 is deposited, and contact holes are formed on the interlayer insulating film 3 by etching. Then, as illustrated in FIG. 4C, a barrier metal film 4 is formed by sputtering. Then, as illustrated in FIG. 4D, an aluminum metal film 5 is formed on the barrier metal film 4 by sputtering. Next, as illustrated in FIG. 4E, a resist pattern is formed on the aluminum metal film 5, and then the barrier metal film 4 and the metal film 5 are simultaneously etched and, after that, the resist is removed, thereby forming aluminum electrodes 10. In this way, a resistance element having electrodes provided at both ends of the resistor 2 can be formed. In a case where the resistor 2 has a small thickness a problem emerging from this method is that the contact holes may pass through the resistor 2 to thereby reduce the contact areas between the aluminum electrodes 10 and the resistor 2 when the contact holes are formed by etching in the step illustrated in FIG. 4B.

Accordingly, in the case where the resistor has a small thickness, a manufacturing method as illustrated in FIGS. 5A to 5F has been conceived. First, as illustrated in FIG. 5A, the barrier metal film 4 is formed on the insulating film 1 by sputtering. Then, as illustrated in FIG. 5B, the aluminum metal film 5 is formed on the barrier metal film 4 by sputtering. Then, as illustrated in FIG. 5C, a resist pattern is formed on the aluminum metal film 5. The barrier metal film 4 and the aluminum metal film 5 are left in a desired shape by etching and then the resist is removed, to thereby form the aluminum electrodes 10. Then, as illustrated in FIG. 5D, a resist 7 is patterned. Then, as illustrated in FIG. 5E, the resistor 2 is formed by sputtering. Then, by removing the resist 7, a resistance element in which the resistor 2 serves also as electrodes for connection can be obtained, as illustrated in FIG. 5F. In the method as illustrated in FIGS. 5A to 5F, a resistor which connects electrodes to each other may be obtained by etching without forming contact holes (see, for example, Published Japanese Patent Application No. H 06-21351).

However, in a semiconductor device described above with reference to FIGS. 5A to 5F, the metal for the interconnection has a large thickness, and thus, stress is applied to the resistor at a corner portion of the metal. As a result, disconnection may occur in a subsequent thermal process, high temperature bias test, or the like.

SUMMARY OF THE INVENTION

In order to solve the problem described above, in a manufacturing method for a semiconductor device according to the present invention, an electrode for connection of a resistor is formed of a barrier metal having a small thickness. Electrodes of the resistor are formed of the barrier metal having a small thickness, and hence stress applied to the resistor may be reduced, and thus, a resistance element which is less liable to cause disconnection and with high reliability may be manufactured. Further, by using the barrier metal which is necessary in the first place to bring a metal interconnection and a Si substrate into contact with each other, an intended resistance element may be manufactured at a reduced cost.

DETAILED DESCRIPTION OF THE PREFERRED EMBODIMENT

In the following description, the best mode for carrying out the present invention is described with reference to the attached drawings.

FIGS. 1A to 1G are sectional views illustrating a sequence of steps of a method of manufacturing a semiconductor device according to an embodiment of the present invention. FIGS. 2A to 2D and FIGS. 3A and 3B are plan views illustrating the method of manufacturing a semiconductor device according to the embodiment of the present invention.

Figure 1A:
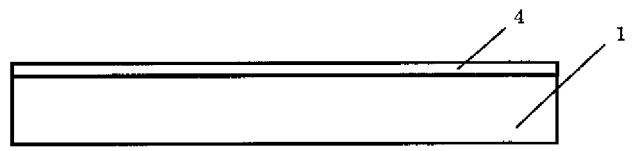
FIGS. 1A to 1G are sectional views illustrating a sequence of steps of a method of manufacturing a semiconductor device according to an embodiment of the present invention.

First, as illustrated in FIG. 1A, an insulating film 1 such as a thermal oxidation film or TEOS is formed on a semiconductor substrate, and, as a barrier metal film (first film) 4, for example, a stacked film of Ti and TiN is formed on the insulating film 1 by sputtering. For example, Ti is formed at a thickness of 300 Å and TiN is formed at a thickness of 600 Å. Note that, the barrier metal film may be formed of Ti or TiW.

Figure 1B:
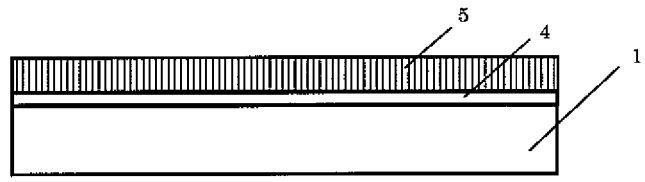
Figure 1C:

Then, as illustrated in FIG. 1B, as an aluminum metal film (second film) 5, for example, Al—Si—Cu is formed at a thickness of 5,000 Å on the barrier metal film 4 by, for example, sputtering. Next, as illustrated in FIG. 1C, a resist pattern is formed on the aluminum metal film 5 by photolithography, and the aluminum metal film 5 and the barrier metal film 4 are continuously etched by, for example, a plasma etching apparatus using a Cl-based gas. Then, the resist pattern is peeled off to form aluminum electrodes 10, in which the barrier metal film and the aluminum metal film are stacked.

Figure 2A:
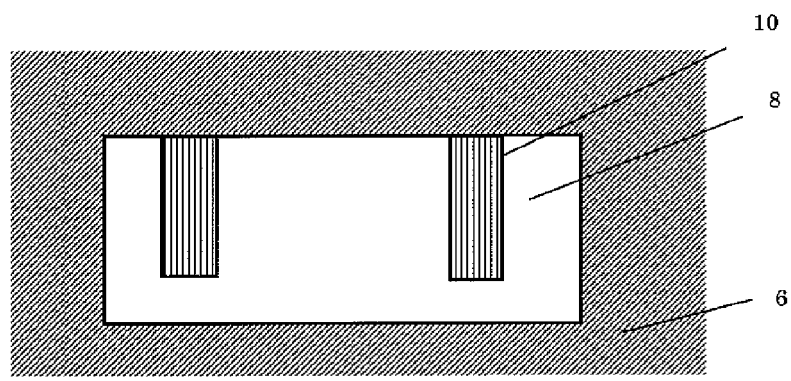
FIGS. 2A to 2D are plan views illustrating the method of manufacturing a semiconductor device according to the embodiment of the present invention.

Then, as illustrated in FIG. 2A, a resist pattern 6 is formed so as to cover a region other than a region including tips of the two aluminum electrodes 10. Here, a resist opening region 8 is provided in the region including the tips of the two aluminum electrodes 10, and the tip regions of the aluminum electrodes 10, which are formed by stacking the barrier metal film and the aluminum metal film, are exposed in the resist opening region 8.

Figure 2B:
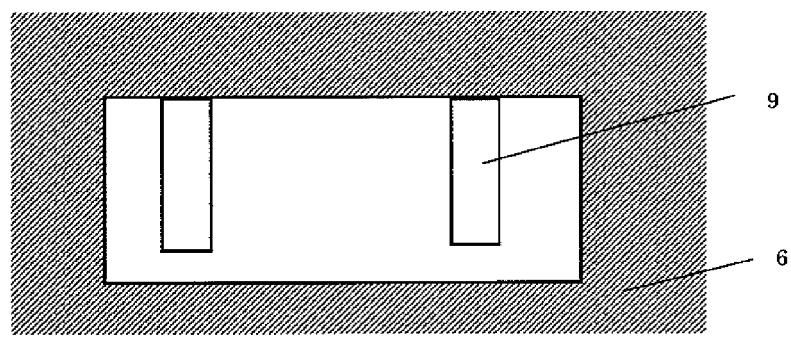

Next, the aluminum metal film corresponding to an upper layer of the aluminum electrodes 10 is selectively removed using the resist pattern 6 as a mask. As an example, by carrying out etching using a phosphoric acid-based etchant as an etchant, the aluminum metal film may be selectively removed without etching the barrier metal film. Here, when the aluminum metal film is Al—Si—Cu, carrying out only wet etching may result in silicon residues left on barrier metal electrodes 9, but such silicon residues may be easily removed by dry etching. When the aluminum metal film is made of Al—Cu, carrying out of only wet etching easily exposes the barrier metal electrodes 9 (FIG. 2B).

Figure 1D:
Figure 1E:
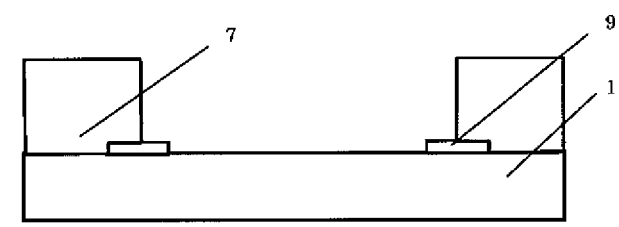
Figure 2C:
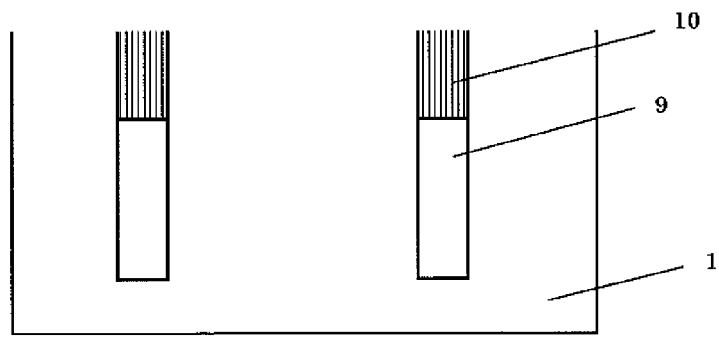
Figure 2D:
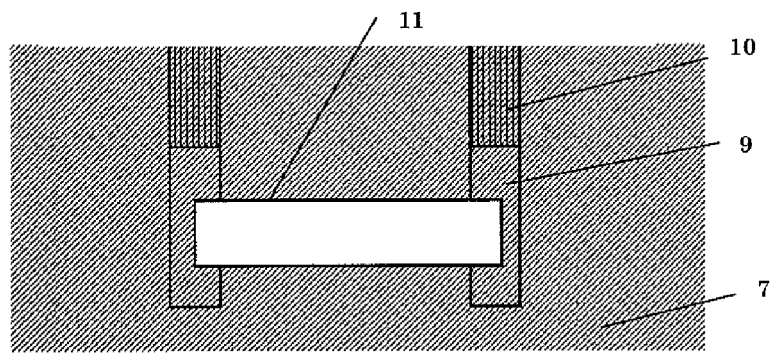

After the resist pattern 6 is peeled off, as illustrated in FIG. 2C, electrodes in which the tip regions of the aluminum electrodes 10 serve as the barrier metal electrodes are formed. FIG. 1D is a sectional view corresponding to FIG. 2C, illustrating a cross section taken along a line which passes through the two barrier metal electrodes 9. Then, as illustrated in FIG. 1E and FIG. 2D, after a resist is applied, a resist pattern 7 is formed so as to expose a region 11 in which a resistor is to be formed later. Here, the thickness of the resist pattern 7 is set sufficiently large, i.e., about five to 100 times as large as the thickness of a resistor 2.

Figure 1F:
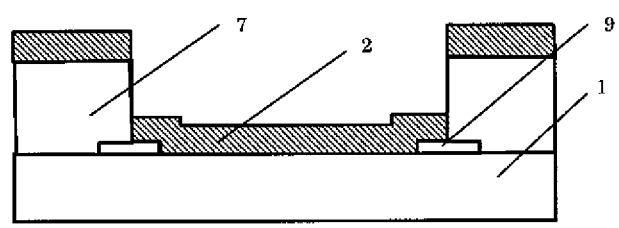

Then, as illustrated in FIG. 1F, after sputter etching to a thickness of about 50 Å to 200 Å is carried out in order to activate a surface of each of the barrier metal electrodes 9, SiCr is formed as a thin film which is to be the resistor 2 at a thickness of about 50 to 100 Å by sputtering. SiCr formed in the region 11 in which the resistor is to be formed is deposited on the insulating film 1 and on the barrier metal electrodes 9, while SiCr formed in other regions is deposited on the resist pattern 7. Note that, SiCr is used as the resistor, but any one of Poly-Si, a-Si, SiCr, SiCrN, and a laminate thereof may also be used.

Figure 1G:
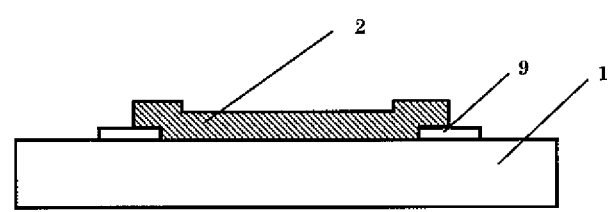
Figure 3A:
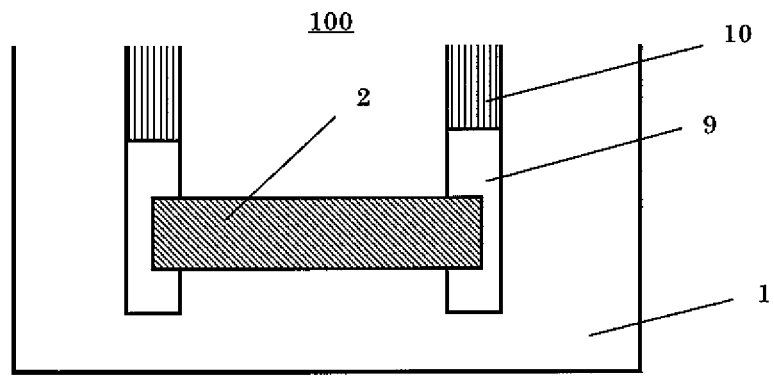
FIGS. 3A and 3B are plan views illustrating the method of manufacturing a semiconductor device according to the embodiment of the present invention.
Figure 3B:
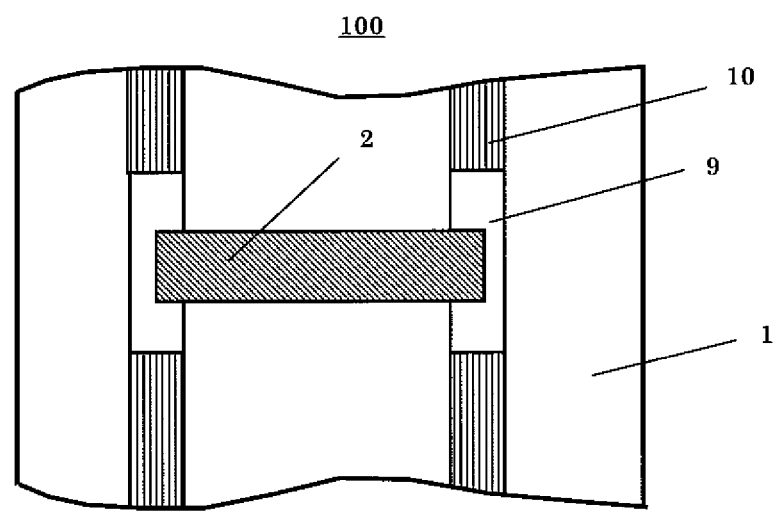
Figure 4A:
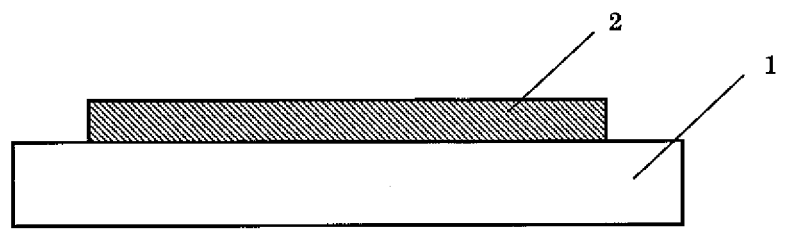
FIGS. 4A to 4E are sectional views illustrating a sequence of steps of a conventional method of manufacturing a semiconductor device.
Figure 4B:
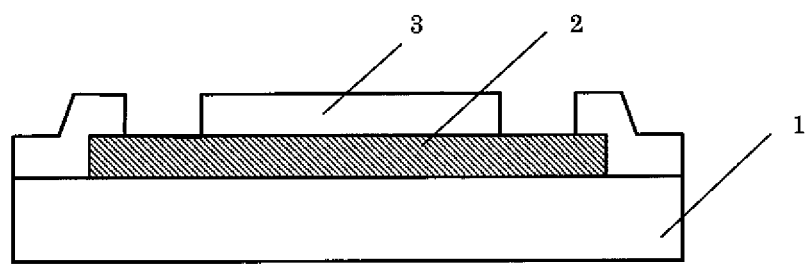
Figure 4C:
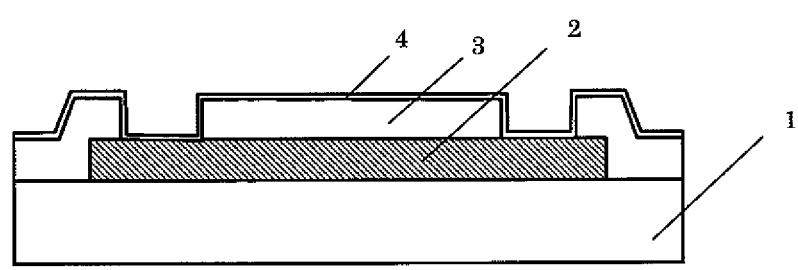
Figure 4D:
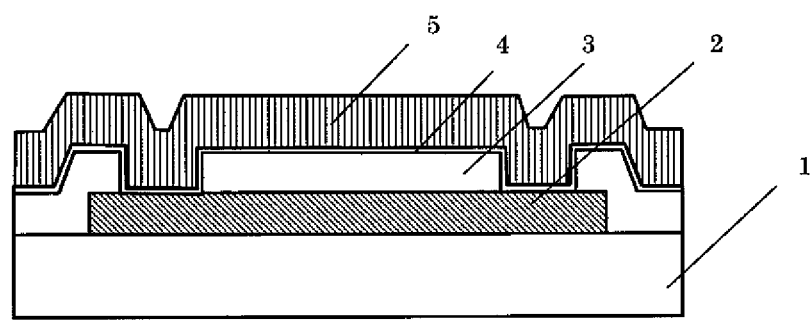
Figure 4E:
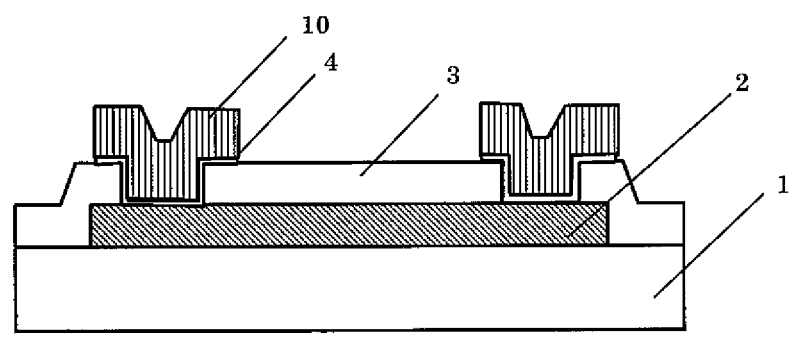
Figure 5A:
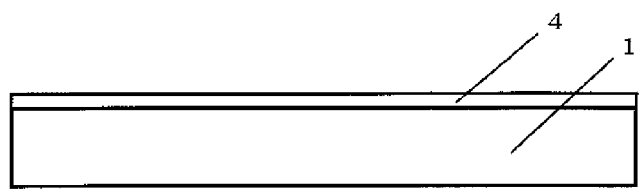
FIGS. 5A to 5F are sectional views illustrating a sequence of steps of another conventional method of manufacturing a semiconductor device.
Figure 5B:
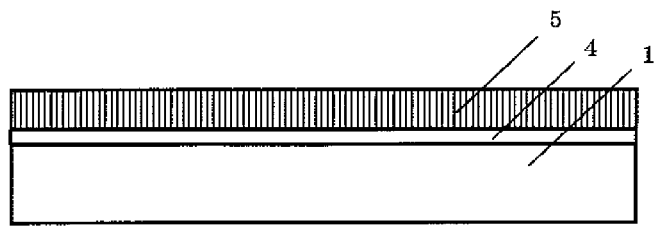
Figure 5C:
Figure 5D:
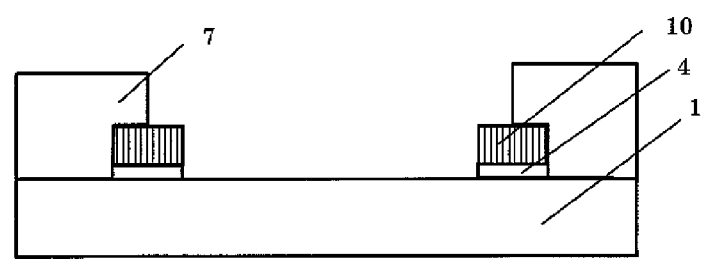
Figure 5E:
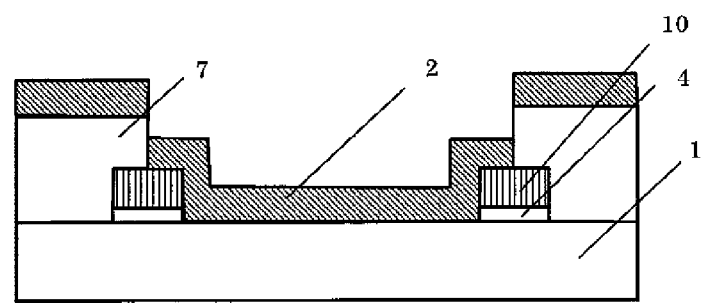
Figure 5F:
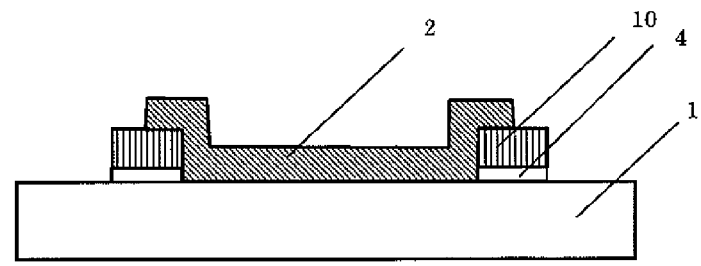

Then, the thin film on the resist pattern 7, together with the resist pattern 7, is immersed in an organic peeling liquid to be lifted-off and peeled from the semiconductor substrate, as illustrated in the sectional view of FIG. 1G. FIG. 3A is a corresponding plan view. The two electrodes are arranged on the insulating film 1 on the semiconductor substrate so as to be separated from each other and in parallel with each other. The tip regions of the electrodes are the single-layer barrier metal electrodes 9, and regions of the electrodes other than the tip regions are the aluminum electrodes 10 in which the barrier metal film and the aluminum metal film are stacked. The resistor 2 is provided so as to connect the two barrier metal electrodes 9 to each other. Both ends of the resistor 2 are on the barrier metal electrodes 9, respectively, to be electrically connected to the barrier metal electrodes 9. With reference again to FIG. 1F, the step height at the junctions of the resistor 2 and the barrier metal electrodes 9 is smaller than 900 Å, which prevents disconnection at the step portions.

In the description above, the resistor is formed at the tip regions of the aluminum electrodes, but it should be understood that the resistor may also be similarly formed in a middle region of the aluminum electrodes. This case is illustrated in a plan view of FIG. 3B.

What is claimed is:

1. A method of manufacturing a semiconductor device, comprising:
    forming a barrier metal film and an aluminum metal film on an insulating film on a semiconductor substrate;
    forming two aluminum electrodes in parallel with each other by patterning the barrier metal film and the aluminum metal film;
    selectively removing the aluminum metal film in a region of part of each of the two aluminum electrodes to form two single-layer barrier metal electrodes separated from each other; and
    forming a resistor between the two single-layer barrier metal electrodes so as to electrically connect the two single-layer barrier metal electrodes to each other.

2. A method of manufacturing a semiconductor device according to claim 1, wherein the forming the resistor comprises:
    forming, with a resist, a resist opening region between the two barrier metal electrodes separated from each other;
    carrying out sputter etching of the two barrier metal electrodes;
    depositing a thin film for forming the resistor; and
    lifting-off the thin film in a region other than the resist opening region to form the resistor.

3. A method of manufacturing a semiconductor device according to claim 2, wherein a thickness of the resist is set to five to 100 times as large as a thickness of the thin film forming the resistor.

4. A method of manufacturing a semiconductor device according to claim 1, wherein the selectively removing the aluminum metal film comprises carrying out wet etching using phosphoric acid.

5. A method of manufacturing a semiconductor device according to claim 1, wherein the barrier metal film is formed of any one of Ti, a stacked film of Ti and TiN, and TiW.

6. A method of manufacturing a semiconductor device according to claim 1, wherein the resistor is formed of any one of Poly-Si, a-Si, SiCr, and SiCrN.

7. A method of manufacturing a semiconductor device according to claim 1, wherein the selectively removing the aluminum metal film comprises etching the aluminum metal film from a tip region of each of the two aluminum electrodes to expose the two barrier metal electrodes.

8. A method of manufacturing a semiconductor device according to claim 1, wherein the selectively removing the aluminum metal film comprises selectively removing the aluminum metal film from a tip region of each of the two aluminum electrodes without removing the barrier metal film.

9. A method of manufacturing a semiconductor device according to claim 1, wherein the resistor is formed of any one of Poly-Si, a-Si, SiCr, and SiCrN.

10. A method of manufacturing a semiconductor device, comprising:
    forming an insulating film on a semiconductor substrate;
    forming a first film of a barrier metal on the insulating film;
    forming on the first film a second film of an aluminum metal;
    forming a resist pattern on the second film, continuously etching the first and second films, and removing the resist pattern to form two aluminum electrodes each made of the first and second metal films;
    selectively removing the first film from a tip region of each of the two aluminum electrodes to form two barrier metal electrodes each made only of the barrier metal; and
    forming a resistor that electrically connects the two barrier metal electrodes.

11. A method of manufacturing a semiconductor device according to claim 10, wherein the forming the resistor comprises:
    forming, with a resist, a resist opening region between the two barrier metal electrodes;
    carrying out sputter etching of the two barrier metal electrodes;

depositing a thin film for forming the resistor; and lifting-off the thin film in a region other than the resist opening region to form the resistor.

12. A method of manufacturing a semiconductor device according to claim 11, wherein a thickness of the resist is set to five to 100 times as large as a thickness of the thin film forming the resistor.

13. A method of manufacturing a semiconductor device according to claim 10, wherein the selectively removing the first film comprises carrying out wet etching using phosphoric acid so that the first film is selectively removed without etching the barrier metal.

14. A method of manufacturing a semiconductor device according to claim 10, wherein the first film is formed of any one of Ti, a stacked film of Ti and TiN, and TiW.

15. A method of manufacturing a semiconductor device according to claim 10, wherein the resistor is formed of any one of Poly-Si, a-Si, SiCr, and SiCrN.

16. A method of manufacturing a semiconductor device according to claim 10, wherein the two barrier metal electrodes are formed in parallel, space-apart relation to one another.

17. A method of manufacturing a semiconductor device, comprising:

forming an insulating film on a semiconductor substrate;

forming a barrier metal film on the insulating film;

forming an aluminum metal film on the barrier metal film;

etching the barrier metal film and the aluminum metal film to form two aluminum electrodes;

forming a resist pattern that covers the two aluminum electrodes except for preselected regions of the two aluminum electrodes;

selectively removing the aluminum metal film from the preselected regions of the two aluminum electrodes and removing the resist pattern so that the preselected regions of the two aluminum electrodes serve as single-layer barrier metal electrodes; and forming a resistor over the insulating film so as to electrically connect the single-layer barrier metal electrodes to one another.

18. A method of manufacturing a semiconductor device according to claim 17, wherein the preselected regions correspond to tip regions of the aluminum electrodes.

19. A method of manufacturing a semiconductor device according to claim 17, wherein the preselected regions correspond to middle regions of the aluminum electrodes.

20. A method of manufacturing a semiconductor device according to claim 17, wherein the barrier metal film is formed of any one of Ti, a stacked film of Ti and TiN, and TiW.

* * * * *